United States Patent [19]

Iwasa

[11] Patent Number: 4,731,751

[45] Date of Patent: Mar. 15, 1988

[54] MAGNETIC BUBBLE MEMORY DEVICE

[75] Inventor: Seiichi Iwasa, Sagamihara, Japan

[73] Assignee: Fujitsu Ltd., Kawasaki, Japan

[21] Appl. No.: 703,984

[22] Filed: Feb. 21, 1985

[30] Foreign Application Priority Data

Feb. 28, 1984 [JP] Japan .................................. 59-35133

[51] Int. Cl.⁴ .............................................. G11C 19/08
[52] U.S. Cl. ............................................ 365/28; 365/2
[58] Field of Search ........................... 365/1, 2, 27, 28

[56] References Cited

U.S. PATENT DOCUMENTS 3,836,896  9/1974  Rifkin ........................................ 365/2
4,096,581  6/1978  Carlo et al. ............................... 365/2
4,330,834  5/1982  Murphy ................................. 364/719

FOREIGN PATENT DOCUMENTS 577562  10/1977  U.S.S.R. ................................. 365/28

Primary Examiner—James W. Moffitt
Attorney, Agent, or Firm—Staas & Halsey

[57] ABSTRACT

A magnetic bubble memory device comprises a magnetic bubble memory chip, a unit for generating a bias field, a magnetic shield, and a unit for compensating the bias field, wherein the thermodependency of the bias field is compensated to approximate that of the operation characteristics of the memory chip over a wide temperature range, thereby providing a wide region in which operation is ensured.

20 Claims, 21 Drawing Figures

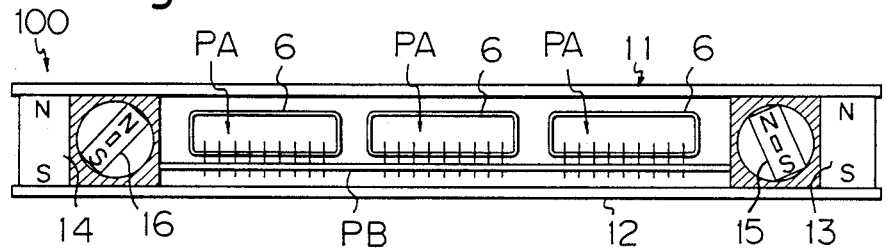
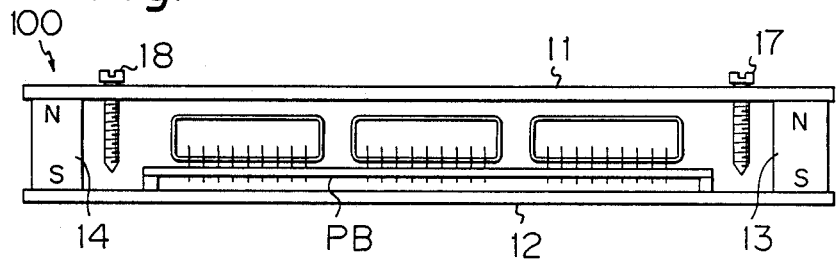
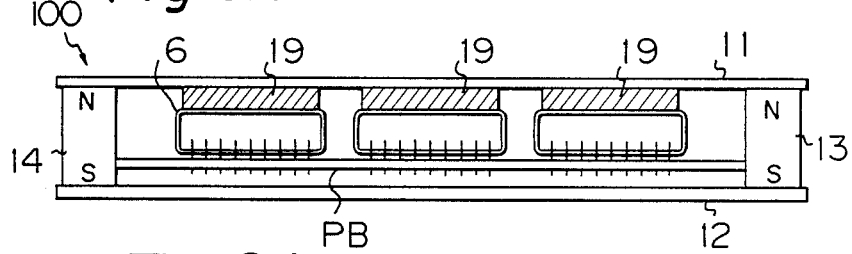
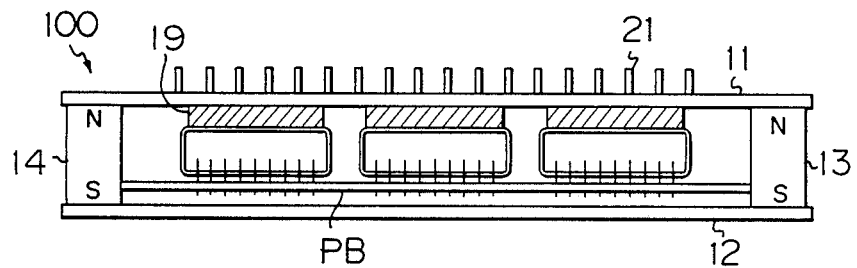

MAGNETIC BUBBLE MEMORY DEVICE

BACKGROUND OF THE INVENTION

The present invention relates to a magnetic bubble memory device (hereinafter referred to as "bubble memory") and, more particularly, to the structure of a package provided with a bias field compensator for compensating the bias field in relation to temperature to ensure stable operation under a wide temperature range.

A bubble memory functions as a solid file memory having no moving parts. Recently, as the scope of use of a bubble memory has increased, its high reliability in operation and resistance against vibration and shock has attracted attention to the possible use of this device as a memory device in aircraft. In a memory device used for this purpose, when an aircraft is flying at stratospheric heights, the memory device is subjected to temperatures as low as −55° C., for example, and it must carry out stable operations at such low temperatures. However, stable operation of a conventional bubble memory cannot be ensured at such low temperatures, as described hereinafter. Accordingly, it is necessary to take measures such that the device is entirely accommodated in an isothermal box so that the temperature in the space surrounding the bubble memory cannot fall to 0° C. or below.

SUMMARY OF THE INVENTION

It is an object of the present invention to eliminate the above-mentioned problem in the prior art, that is, to provide a superior magnetic bubble memory device which can ensure stable operation over a temperature range wider than the conventional range, without taking particular measures to keep the device warm.

To achieve the above-mentioned object, it must be taken into consideration that the narrow temperature range for ensuring stable operation in a conventional device stems from the difference in thermodependency between the operation characteristic of a magnetic bubble memory chip and the bias field generated by permanent magnets. That is, as described hereinafter, the cause resides in the fact that the thermodependency of the upper limit and the lower limit of the operational region of the memory chip is nonlinear, while that of the bias field generated by the permanent magnets is linear, and as long as the thermodependency of the bias field is linear, it is impossible to ensure stable operation over a temperature range wider than that of a conventional device.

According to the present invention, a bubble memory is provided with a bias field compensator for compensating the bias field so that its thermodependency approximates that of the operation characteristics of the memory chip over a wide temperature range, thereby ensuring a wide region of stable operation.

In accordance with the above object, a magnetic bubble memory device according to the present invention comprises a magnetic bubble memory chip, means for generating a bias field for the maintenance of magnetic bubbles in the memory chip, a magnetic shield disposed externally to the bias field-generating means for isolating an external magnetic field, and means for compensating the bias field in accordance with the temperature.

In an embodiment of the present invention, the bias field compensation means comprises means disposed externally to the magnetic shield and generating a compensation field having an opposite direction to that of the bias field.

In a preferred embodiment of the present invention, the compensation field becomes strong as the temperature falls and, at a predetermined temperature, for example, 20° C. or below, exceeds the shield limit of the magnetic shield, whereby the bias field is compensated.

Another preferred embodiment comprises means for adjusting the compensation field, which means may be constituted of, for example, permanent magnets, or screws of magnetic material.

In a further preferred embodiment, a spacer of a nonmagnetic material, in particular, a thermal conductive material such as aluminum, copper, or ceramic, is disposed between the compensation field-generating means and the magnetic shield, whereby a reduction in undesirable interference between the bias field and the compensating field and an improvement in heat radiation can be obtained. Moreover, the provision of heat-radiating elements for the compensation field-generating means results in a further improvement in heat radiation.

In a still further preferred embodiment, the magnetic bubble memory chip, the bias field-generating means, and the magnetic shield are assembled together into a memory package, and one or more memory package(s) are mounted, preferably together with other electrical circuit elements which are not influenced by the magnetic field, on a mounting board, such as a printed-circuit board, so as to construct a unit. In this case, one set of the compensation field-generating means may be provided for each memory package, or one set for the entire unit, in such a manner that it can be used in common by all of the memory packages.

The present invention is now described in detail based on the preferred embodiments and in comparison with the prior art, with reference to the accompanying drawings.

BRIEF EXPLANATION OF THE DRAWINGS

FIGS. 1 through 6 illustrate the prior art, wherein:

FIGS. 1 and 2 are a partially broken, disassembled, perspective view and a diagrammatic side view, respectively, illustrating a structure of a magnetic bubble memory package;

FIG. 3 is a diagram showing the operation characteristics of a memory chip;

FIG. 4 is a diagram showing the thermal characteristic of a free bubble collapse field of a bubble crystal;

FIG. 5 is a diagram showing the thermal characteristics of a bias field-generating permanent magnet and a memory chip; and FIG. 6 is a diagram showing the thermal characteristic of a memory package.

FIGS. 7 through 21 illustrate embodiments of the present invention, wherein:

FIG. 7 is a side view of a first embodiment of a magnetic bubble memory package;

FIG. 8 is a diagram showing the shield characteristic of a magnetic shield case;

FIG. 9 is a diagram showing the compensation of a bias field;

FIG. 10 is a diagram showing the thermal characteristic of a memory package;

FIGS. 11 through 14 are side views of second, third, fourth, and fifth embodiments of a magnetic bubble memory package, respectively;

FIG. 15 is a side view of a first embodiment of a magnetic bubble memory unit in which magnetic bubble memory packages are mounted on a printed circuit board;

FIGS. 16 and 17 are a side view and a partially broken perspective view of a second embodiment of a magnetic bubble memory unit, respectively; and FIGS. 18 through 21 are side views of third, fourth, fifth, and sixth embodiments of the magnetic bubble memory unit, respectively.

DESCRIPTION OF THE PREFERRED EMBODIMENTS

Figure 1:
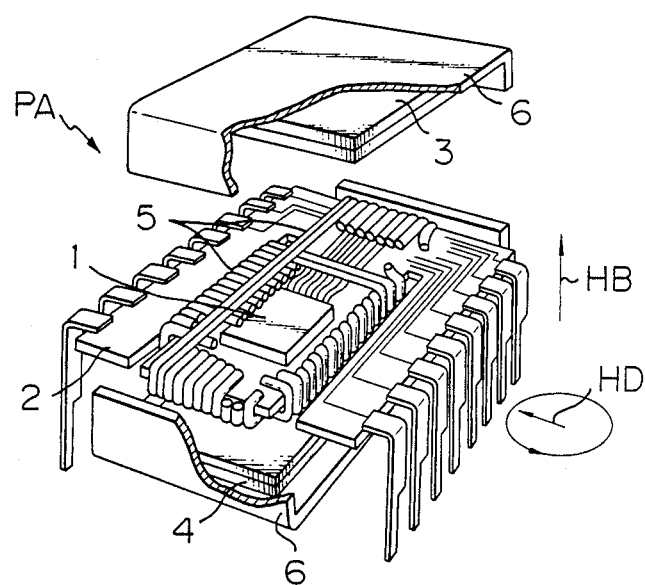
Figure 2:
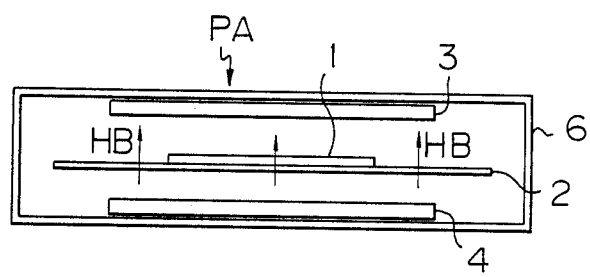

First, the prior art will be described with reference to FIGS. 1 through 6. FIGS. 1 and 2 are a partially broken, disassembled, perspective view and a diagramatic side view, respectively, illustrating a structure of a conventional bubble memory package. In these figures, the reference characters PA designate the package in general, which comprises a magnetic bubble memory chip 1 (hereinafter referred to as "memory chip"), a printed circuit board 2 for mounting the memory chip 1 thereon, permanent magnets 3 and 4 generating a bias field $H_B$ for maintenance of the magnetic bubbles (hereinafter referred to as "bubbles") in the memory chip 1, coils 5 for generating an in-plane rotating field $H_D$ for driving the bubbles, and a magnetic shield case 6 for isolating the above elements from the external magnetic field.

The memory chip 1 basically comprises a substrate of a single crystal, such as gadolinium-gallium-garnet, on which a magnetic thin film (i.e., bubble crystal) of magnetic garnet is formed by a liquid phase epitaxial growth technique. Information is stored in the memory chip, in such a manner that "1" and "0 (zero)" of a binary coded information correspond to "existence" and "non-existence" of the bubble in the bubble crystal, respectively. The bubble is a bubble-shaped magnetic domain existing in the bubble crystal and can exist only under the application of a bias field having a suitable strength. The bubble collapses when the bias field is stronger than a certain strength, and strips out into a stripe domain when the bias field is weaker than a certain strength. The bias fields having such strengths are called a "collapse field" and a "strip-out (or stripe-out) field", respectively. Moreover, the memory chip 1 is provided, on the bubble crystal, with various functional sections performing functions such as generation, transfer, replication, and detection of the bubble, and with bubble propagation tracks defined by patterns of magnetically soft material, such as permalloy, or ion-implanted patterns. The application of the in-plane rotating drive field $H_D$ causes the bubbles to be propagated along the propagation tracks, and the application of control currents to the functional sections controls the bubbles, so that the writing and the reading of information are performed.

Figure 3:
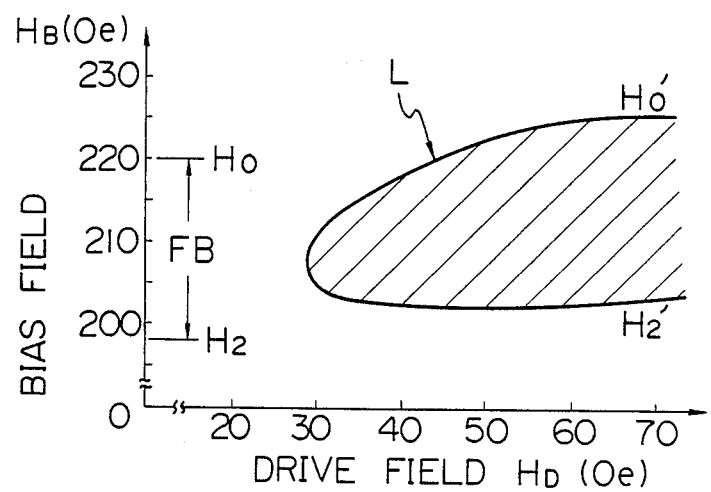

The operation characteristics of such bubble memory chips are usually judged by an operational margin of the bias field $H_B$ with respect to the drive field $H_D$. For example, the operation characteristic of a memory chip employing 2-μm bubbles is shown in FIG. 3, in which the abscissa shows the drive field $H_D$ and the ordinate shows the bias field $H_B$. In this figure, the reference characters $H_0$ and $H_2$ designate the collapse field and the strip-out field described hereinbefore, respectively, and the range FB between $H_0$ and $H_2$ shows the free bubble existence range, i.e., the range of bias field where the bubbles can freely exist in the bubble crystal without the bubble propagation tracks or the like. On the other hand, a line L is a operational margin line, and the region (hatched for elucidation) surrounded by the line L is the operation region of the memory chip. The upper limit $H_0'$ of the operation region shows the strength of bias field, at which the bubble being propagated collapses, and the lower limit $H_2'$ shows the strength of bias field at which the bubble strips out along or from the propagation track. It is known that the operation region is usually slightly higher than the free bubble existence range FB, but the upper limit $H_0'$ and the lower limit $H_2'$ of the operation region are proportionate to the free bubble collapse field $H_0$.

Figure 4:
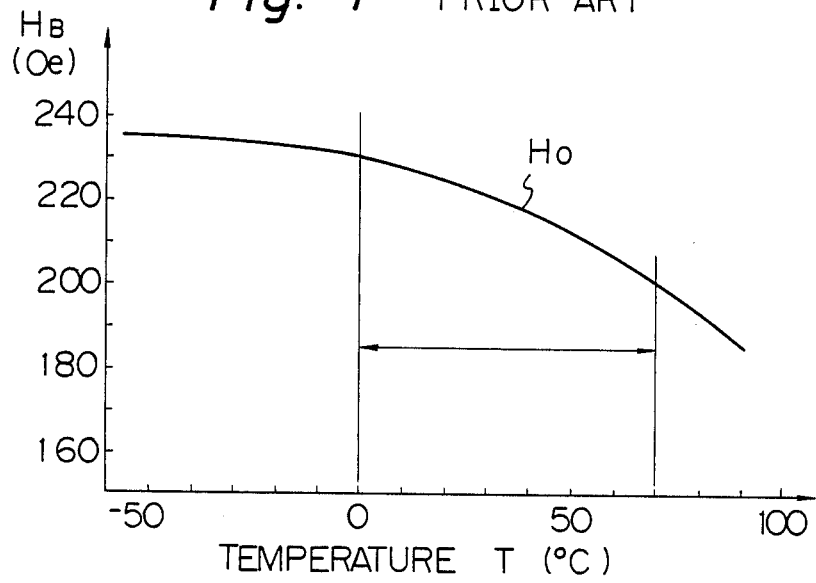
Figure 5:
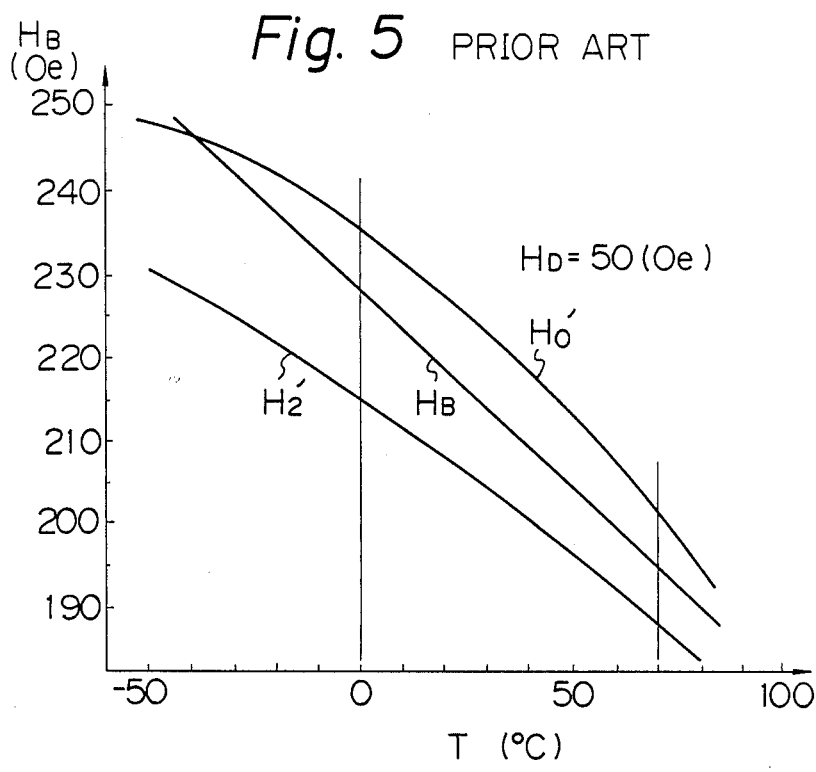
Figure 6:
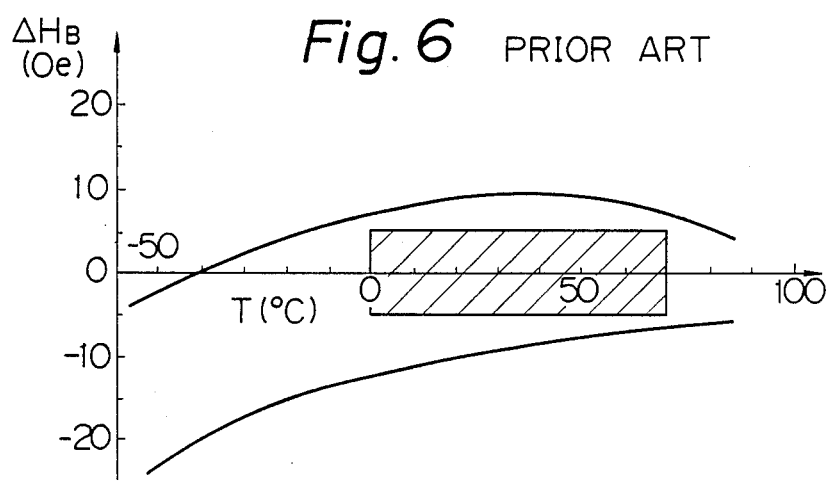

The operation of the bubble memory chip depends on the temperature. FIG. 4 shows the thermodependency of the free bubble collapse field $H_0$. As illustrated, $H_0$ varies nonlinearly with respect to the variation of the temperature T, but the average rate of variation over the range from 0° C. to 70° C. is −0.2%/°C. FIG. 5 shows the thermodependency of the operation characteristics of the memory chip under the drive field of $H_D=50$ Oe. Both the upper limit $H_0'$ and the lower limit $H_2'$ of the operation region have the average rate of variation of about −0.2%/°C. over the range from 0° C. to 70° C. where the permanent magnet is of Sr-ferrite or Ba-ferrite, for example, the magnetic field generated thereby varies linearly with respect to the temperature at the rate of −0.2%/°C. Conventionally, permanent magnets having such thermal characteristics have been used to generate the bias field $H_B$ as shown in FIG. 5, for example. FIG. 6 shows the thermodependency of the difference $\Delta H_B$ between the bias field $H_B$ and the upper limit $H_0'$ and the lower limit $H_2'$ of the operation region shown in FIG. 5. The hatched region in FIG. 6 shows the region in which operation is ensured, and as can be clearly understood, the operation is ensured over the range from 0° C. to 70° C. However, according to the conventional structure, the operation cannot be ensured at a temperature as low as −55° C., as mentioned above.

Figure 7:
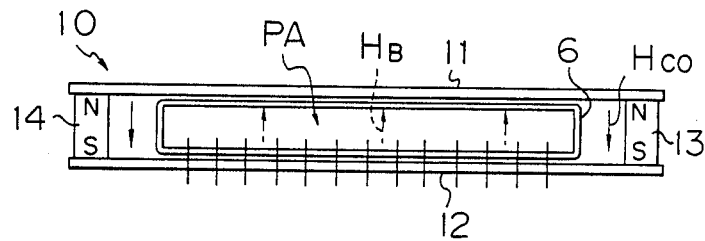

Next, the embodiments of the present invention will be described. FIG. 7 is a side view of an embodiment of a magnetic bubble memory package according to the present invention. In the figure, the reference character PA designates a package in general which is the same as the conventional package shown in FIG. 2. A compensation field generator 10 is disposed externally of the package PA. The compensating field generator 10 comprises plates 11 and 12 made of magnetically soft material, such as permalloy, disposed on upper and lower sides of the magnetic shield 6 of the package PA, and permanent magnets 13 and 14 disposed between the plates 11 and 12 at the opposite end portions of these plates 11 and 12. The permanent magnets 13 and 14 are arranged so that their north (N) poles and south (S) poles are oriented upwards and downwards in the figure, respectively, whereby a compensation field $H_{CO}$ opposite in direction to the bias field $H_B$ is generated between the plates 11 and 12. Where the permanent magnets 13 and 14 are of Ba-ferrite or Sr-ferrite, the compensation field $H_{CO}$ also varies at the rate of −0.2%/°C.

Figure 8:
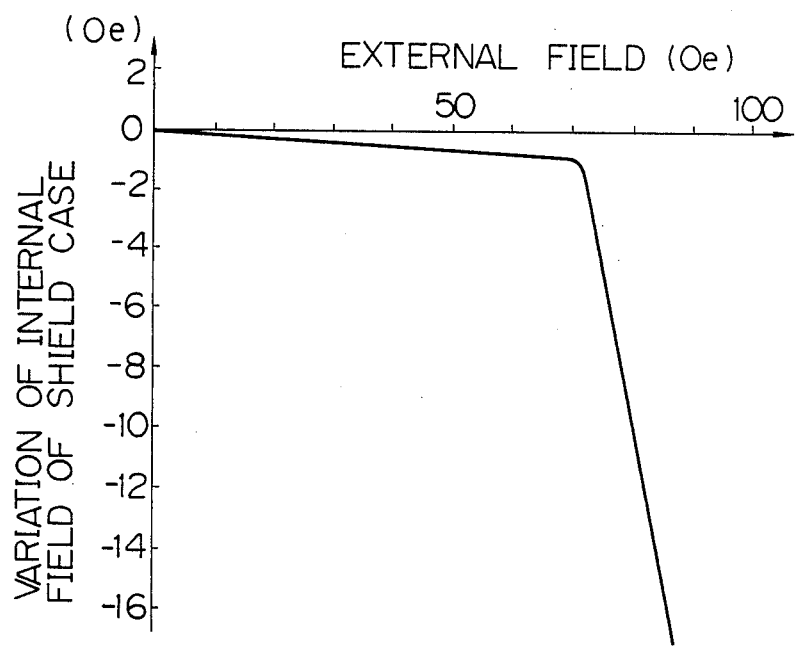

On the other hand, FIG. 8 shows the shield characteristic of the shield case 6. As can be understood from the figure, the internal field of the shield case abruptly varies when the external field exceeds 70 Oe. This means that the shield case is saturated by the external field of 70 Oe and thus permits the field component exceeding 70 Oe to pass therethrough.

Accordingly, where the compensation field $H_{CO}$ generated by the magnets 13 and 14 is predetermined to be 70 Oe at 20° C., the strength of $H_{CO}$ and the reduction $-\Delta H_B$ of the bias field $H_B$ caused by the component of the field $H_{CO}$ passing through the shield case, in the range of temperature lower than 20° C., are as shown in Table 1.

TABLE 1

| T° C. | −55 | −40 | −20 | 0 |
|---|---|---|---|---|
| $H_{CO}$ Oe | 80.1 | 78.6 | 75.7 | 72.8 |
| $-\Delta H_B$ Oe | 10.1 | 8.6 | 5.7 | 2.8 |

Figure 9:
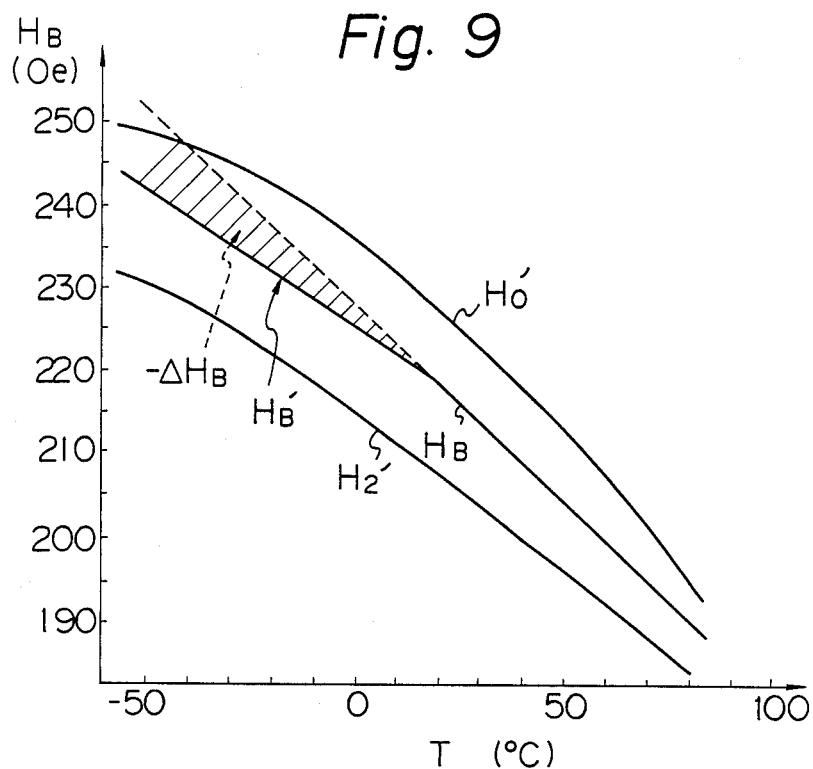
Figure 10:
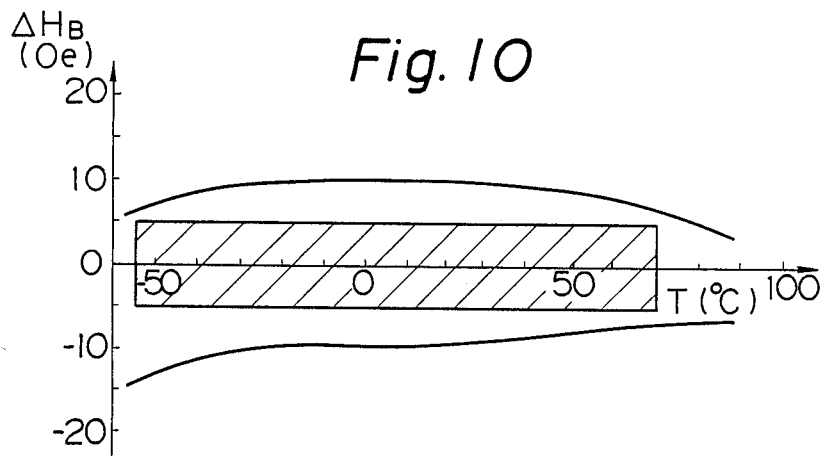

As a result, as shown in FIG. 9 and similar to FIG. 5, the bias field $H_B$ is formed, as shown by the dashed line, beginning at the point of about 20° C. In the figure, the hatched region shows the reduction $-\Delta H_B$ of $H_B$, and the line $H_B'$ shows the compensated bias field. Therefore, it can be understood from the figure that, over the range of temperature from −55° C. to 20° C., the rate of variation of the bias field $H_B'$ approximates those of the upper limit $H_0'$ and the lower limit $H_2$ of the operation region. It should be noted that, in the range of temperature of 20° C. or more, the compensation field $H_{CO}$ is absorbed by the shield case 6 and the invasion is as small as 1 Oe and, accordingly, the bias field $H_B$ varies in accordance with the original thermodependency to present a thermal characteristic similar to the conventional one. FIG. 10 shows the region (hatched region) in which operation is ensured in relation to FIG. 9, in the same manner as in FIG. 6. As can be seen from this figure, a stable operation can be ensured over a wide temperature range of from −55° C. to 70° C.

It should be noted that the shield case 6 loses the shield function when saturated with the compensating field $H_{CO}$, but because the magnetically soft plates 11 and 12 disposed externally of the shield case also have the shield functions, the external field still can be effectively isolated.

FIGS. 11 through 14 show second through fifth embodiments of the bubble memory package according to the present invention. The basic structure and operation in these embodiments are the same as in the first embodiment described above, and accordingly, the same or similar parts are designated by the same references.

Figure 11:
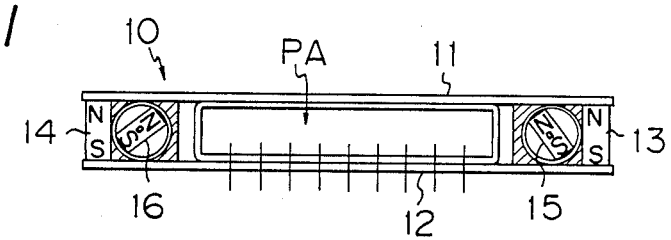

In the second embodiment illustrated in FIG. 11, small permanent magnets 15 and 16 are rotatably disposed at the opposite end portions of the magnetically soft plates 11 and 12. The rotation of these magnets causes the angle of their magnetic axes with respect to the direction of the compensation field to vary, thereby adjusting the strength of the compensation field $H_{CO}$ (FIG. 7) between the magnetically soft plates 11 and 12.

Figure 12:
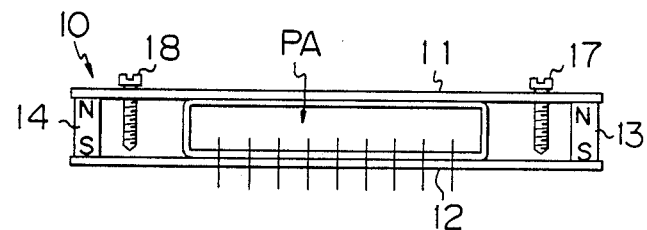

In the third embodiment illustrated in FIG. 12, the magnetically soft plate 11 is provided with screws 17 and 18 of magnetic material at the opposite end portions. By screwing-in or -out these screws, the strength of the compensation field $H_{CO}$ can be adjusted similarly to the above-mentioned embodiment.

Figure 13:
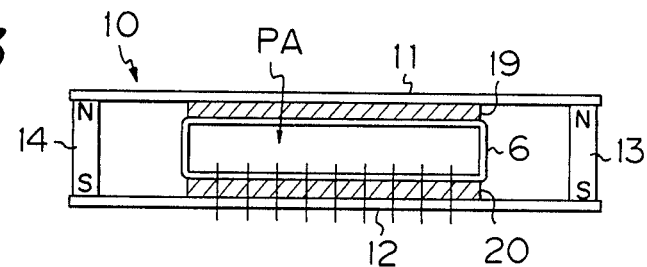

In the fourth embodiment illustrated in FIG. 13, spacers 19 and 20 (hatched for elucidation) of non-magnetic material are disposed between the shield case 6 and the magnetically soft plates 11 and 12. This structure provides the reduction in undesirable interference between the bias field and the compensation field The spacers 19 and 20 are preferably of heat conductive material, such as Al, Cu, or ceramics, for providing good heat radiation.

Figure 14:
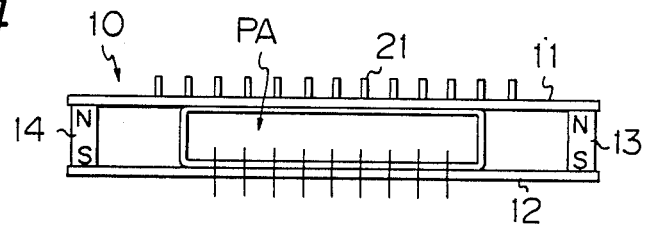

In the fifth embodiment illustrated in FIG. 14, the magnetically soft plate 11 is provided with heat-radiating fins 21 on the surface thereof. Accordingly, the plate 11 also serves as a heat radiator, whereby the thermal characteristic in the high temperature range is also improved. The magnetically soft plate 11 may be provided with undulations on its surface, instead of the fins 21. In this case, the surface of the plate 11 itself may be undulated, or another plate with the undulation preformed may be attached to the plate 11.

Further, the spacers 19 and 20 and the heat-radiating fins 21 described above may be used in combination, and the spacers 19 and 20 and/or the heat-radiating fins 21 may be provided in the embodiments illustrated in FIGS. 7, 11, and 12.

Figure 15:
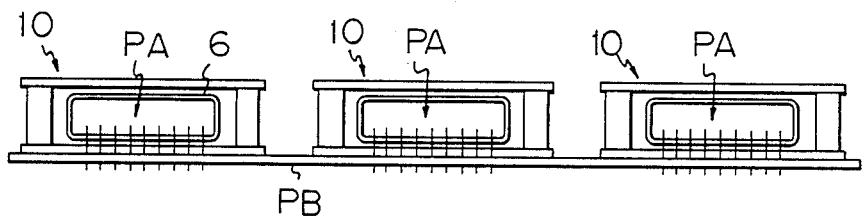

Usually, one or more of the magnetic bubble memory packages mentioned above are mounted on a mounting board, so as to construct a unit. FIG. 15 shows a first embodiment of such a magnetic bubble memory unit, in which three packages PA are mounted on a printed circuit board PB, and each of the packages PA is provided with the above-described compensation field generator 10, so that the bias fields in the packages are individually compensated.

In this unit, the compensation field generator 10 may be any one of those illustrated in FIGS. 7 and 11 through 14 or may be constructed by a combination of those units.

Further, it is taken as a matter of course that, in this unit, electric circuit elements other than the memory package, such as integrated circuits (IC), resistances, or capacitors, which are not influenced by the magnetic field, can be mounted together on the printed circuit board PB.

Figure 16:
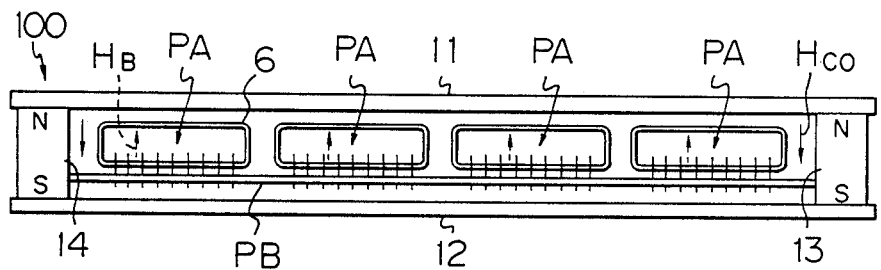
Figure 17:
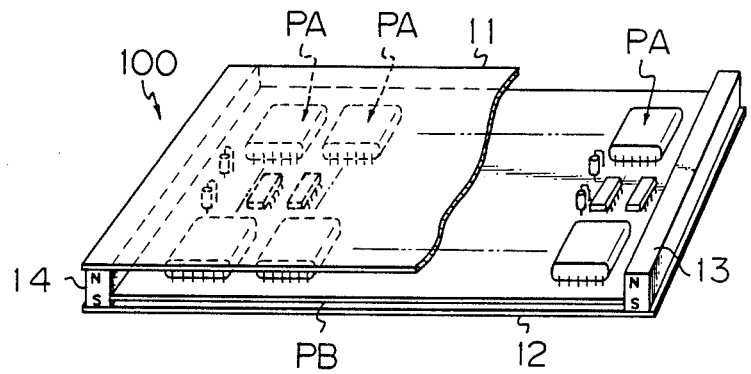

FIGS. 16 and 17 show a second embodiment of the magnetic bubble memory unit, in which the compensation field generator is not provided to each of the packages, but a compensation field generator 100 which is common to all of the packages PA is disposed externally of the unit to accommodate the latter therein. The compensation field generator 100 has the same structure, except for the size, as that of the above-described compensation field generator 10, and its component parts are designated by the same references. The structure of this embodiment has an advantage in that modification in particular of the assembled unit or reconstruction of the unit in use is easy, because it is necessary only to add the compensation field generator to the unit externally of the latter.

Further, this second embodiment of the unit also may be further provided with the compensation field-adjusting means, i.e., the permanent magnets 15 and 16 or the screws 17 and 18, the spacers 19, and the heat-radiating fins 21, similar to the embodiments illustrated in FIGS. 11 through 14. FIGS. 18 through 21 show such embodiments. A third embodiment illustrated in FIG. 18 comprises permanent magnets 15 and 16, as in the embodiment illustrated in FIG. 11, and a fourth embodiment illustrated in FIG. 19 comprises screws 17 and 18, as in the embodiment illustrated in FIG. 12. A fifth embodiment illustrated in FIG. 20 comprises spacers 19, as in the embodiment illustrated in FIG. 13, but the spacers 19 are disposed only between the upper magnetically soft plate 11 and the magnetic shields 6 of the packages. A sixth embodiment illustrated in FIG. 21 corresponds to the fifth embodiment illustrated in FIG. 20, but further comprises heat-radiation fins 21, as in the embodiment illustrated in FIG. 14.

Furthermore, it is also taken as a matter of course that, in the embodiments illustrated in FIGS. 16 through 21, electric circuit elements which are not influenced by the magnetic field can be mounted together with the packages PA on the printed circuit board PB.

As described above, the present invention can provide a magnetic bubble memory device in which operation is ensured over a very wide temperature range, together with a high reliability against vibration and shock, and accordingly, can be applied for use for many various purposes.

I claim:

1. A magnetic bubble memory device, comprising;
a magnetic bubble memory chip;
means for generating a bias field for maintenance of magnetic bubbles in said memory chip;
a magnetic shield disposed externally of said bias field-generating means for isolating an external magnetic field; and
mean, disposed externally of said magnetic shield, for compensating said bias field in accordance with the temperature, and for generating a compensation field opposite in direction to said bias field.

2. A magnetic bubble memory device according to claim 1, wherein said compensation field-generating means comprises a heat-radiating element.

3. A magnetic bubble memory device according to claim 1, wherein the strength of said compensation field increases as the temperature is lowered.

4. A magnetic bubble memory device according to claim 3, wherein the strength of said compensation field exceeds the shield limit of said magnetic shield, at or below a predetermined temperature.

5. A magnetic bubble memory device according to claim 4, wherein said predetermined temperature is about 20° C.

6. The device of claim 5, having an operating range from −50° to 70° C.

7. The device of claim 5, having an operating range of temperature that is 120° C. in width.

8. A magnetic bubble memory device according to claim 1, wherein said compensation field-generating means comprises two plates of magnetically soft material disposed on the upper and lower sides of said magnetic shield, respectively, and permanent magnets disposed between said magnetically soft plates at the end portions of the plates.

9. The device of claim 8, having an operating range from −50° to 70° C.

10. A magnetic bubble memory device according to claim 1, further comprising means for adjusting the strength of said compensation field.

11. A magnetic bubble memory device according to claim 10, wherein said adjusting means comprises a permanent magnet rotatable so that the angle of its magnetic axis with respect to the direction of the compensation field is varied.

12. A magnetic bubble memory device according to claim 10, wherein said adjusting means comprises a screw of a magnetic material which can be screwed into, or out of, said compensation field-generating means In the direction of the compensation field.

13. A magnetic bubble memory device according to claim 1, further comprising a spacer of nonmagnetic material disposed between said compensation field-generating means and said magnetic shield.

14. A magnetic bubble memory device according to claim 13, wherein said spacer is made of heat conductive material.

15. A magnetic bubble memory device according to claim 13, wherein said spacer is made of aluminum, copper, or a ceramic.

16. A magnetic bubble memory device according to claim 1, wherein said magnetic bubble memory chip, bias field-generating means, and magnetic shield are assembled into a magnetic bubble memory package, and one or more of said memory packages are mounted on a mounting board, so as to construct a magnetic bubble memory unit.

17. A magnetic bubble memory device according to claim 16, wherein said mounting board is a printed circuit board.

18. A magnetic bubble memroy device according to claim 16, wherein said memory unit comprises electric circuit elements which are not influenced by the external magnetic field, said ciruct elements being mounted together with said memory packages on said mounting board.

19. A magnetic bubble memory device according to claim 16, wherein each of said memory packages is provided with said bias field-compensating means. provided with said bias field-compensating means.

20. A magnetic bubble memory device according to claim 16, wherein said bias field-compensating means is provided for said entire memory unit to be used in common for all of said memory packages.

* * * * *